United States Patent [19]

Ando

[11] 4,275,365
[45] Jun. 23, 1981

[54] BRANCHING EQUIPMENT FOR CATV SYSTEMS

[75] Inventor: Tsunekazu Ando, Hiratsuka, Japan

[73] Assignee: Hochiki Corporation, Tokyo, Japan

[21] Appl. No.: 66,477

[22] Filed: Aug. 13, 1979

[30] Foreign Application Priority Data

Aug. 18, 1978 [JP] Japan .......................... 53-112427[U]

[51] Int. Cl.³ .............................................. H03H 7/48
[52] U.S. Cl. ..................................... 333/131; 333/119
[58] Field of Search ............... 333/100, 112, 119, 131; 323/77

[56] References Cited

U.S. PATENT DOCUMENTS 3,925,737  12/1975  Headley ........................... 333/112 X Primary Examiner—Paul L. Gensler
Attorney, Agent, or Firm—Haseltine and Lake

[57] ABSTRACT

In branching equipment for CATV systems, including a distributing transformer consisting of a tapped winding, ends of which are connected to a pair of output terminals whereby a television signal applied to the tap is distributed to the output terminals with a current level ratio determined by the ratio of the number of turns in the winding portion on one side of the tap to that in the winding portion on the other side of the tap, an electric power absorbing resistor is connected between the tap and one of the output terminals so as to reduce the interaction of undesired signals between the output terminals.

1 Claim, 4 Drawing Figures

BRANCHING EQUIPMENT FOR CATV SYSTEMS

BACKGROUND OF THE INVENTION

The present invention relates to branching equipment for CATV systems for distributing television signals from the main line of a CATV system to a number of branch lines.

In the CATV system, a television signal received by the community antenna is delivered to the main line from which the signal is distributed to a plurality of branch lines and then applied to the individual TV receivers. For this purpose, branching equipment is provided at various points of the main line and generally the branching equipment is of a simple type. It is known to use as a branching equipment, a distributing equipment of the type comprising a matching transformer consisting of a center-tapped winding whose one end serves as an input terminal and the other end is grounded and a distributing transformer consisting of a center-tapped winding whose ends are each adapted to serve as an output terminal and the center taps are interconnected whereby the signal applied to the input terminal is distributed to the output terminals at the same level. Since the ratio between the signal levels at the output terminals will be varied with a change in the turn ratio of the winding portions on both sides of the tap of the distributing transformer, this type of distributing equipment can be used as branching equipment by suitably selecting the turn ratio. If branching equipment comprising such distributing equipment is used for the purpose of distributing TV signals from the main line of a CATV system to the branch lines, there is the danger of a situation arising in which the leakage of the local oscillation signal from a TV receiver connected to one of the output terminals will result in interaction between the output terminals and this in turn will result in mutual interference between the leakage signal and the TV signal in the transmission line.

In the past, many different countermeasures have been proposed for the purpose of reducing such undesired signals and they have been unsatisfactory from the standpoint of both performance and construction due to the difficulty of ensuring the desired results in both the UHF and VHF bands, that is, the difficulty to ensure the desired reduction of undesired signals in a wide range of the bands, the necessity to use another tapped transformer as a balance transformer and so on.

SUMMARY OF THE INVENTION

It is therefore the principal object of the present invention to provide branching equipment for CATV systems comprising distributing equipment of the type previously described in which only the addition of a resistor can ensure a flat frequency characteristic throughout a wide range of bands extending from the UHF band to the VHF band and can effectively prevent the interaction of undesired signals between the output terminals and hence the mutual interference of the undesired signals with the TV signals and thus ensure simplification in the circuitry and construction.

In accordance with the invention there is thus provided branching equipment for CATV systems comprising an input terminal, two output terminals, a tapped matching transformer consisting of a tapped winding whose one end is connected to the input terminal and other end is grounded, a tapped distributing transformer consisting of a tapped winding whose ends are connected to the output terminals, the taps of both transformers being connected to each other, the ratio of the number of turns in the winding portion between the one winding end and the tap of the distributing transformer to that in the winding portion between the other winding end and the tap are selected so that the TV signal applied to the tap is divided to the output terminals with a desired level ratio, and a power absorbing resistor through which one of the output terminals is connected to the tap of the distributing transformer.

In this case, one of the output terminals for delivering the TV signal of a relatively high current level is usually used as a main line output terminal connected to the main line at a point near the terminal end and the other output terminal for delivering the TV signal of a relatively low current level is used as a branch line output terminal connected to the individual TV receivers through the branch lines.

When a undesired signal current flows from the output terminal side to one of the winding portions of both sides of the tap of the distributing transformer, the undesired signal current causes a voltage drop in that one winding portion and a voltage of the opposite polarity to the voltage drop is induced in the other winding portion. Thus, if the voltage drop and the induced voltage are of the same magnitude, they will cancel each other and there will be no interaction of the undesired signal between the output terminals. Thus, in accordance with the invention the resistor is connected, for the purpose of power absorption, in parallel with one of the winding portions in which a greater voltage drop will be caused when currents of the same value are supplied to the winding portions, thus making the tap into an effective center tap with respect to undesired signals applied from the output terminal side. More specifically, since one of the winding portions on the sides of the tap which has a greater number of turns is on the branch line output terminal side and the other winding portion having a smaller number of turns is on the main line output terminal side, the power absorbing resistor is connected in parallel with the winding portion having a greater number of turns, that is, between the tap and the branch line output terminal.

The present invention as well as prior art equipment will now be described with reference to the accompanying drawings.

DESCRIPTION OF THE PREFERRED EMBODIMENT

Figure 1:
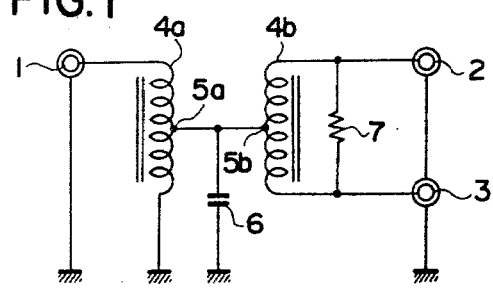
FIG. 1 is a circuit diagram showing prior art equipment incorporating a resistor to prevent the interaction of signals between the output terminals of the ordinary distributing equipment.

Referring first to FIG. 1 showing prior art equipment designed to prevent the interaction of signals between the output terminals of distributing equipment which divides the input signal to the output terminals at the same level, numeral 1 designates an input terminal, 2 and 3 are output terminals, 4a a matching transformer, and 4b a distributing transformer; the transformer 4a and 4b each consisting of a winding wound on the same core. The winding of the matching transformer 4a has its one end connected to the input terminal 1 and the other end connected to the ground and the winding is also provided with a center tap 5a. On the other hand, one end of the winding of the distributing transformer 4b is connected to the output terminal 2 and the other end is connected to the other output terminal 3. The winding is also provided with a center tap 5b. The center taps 5a and 5b of the transformers 4a and 4b are connected to each other, and a capacitor 6 is connected between the junction of the center taps and the ground. A resistor 7 is connected between the ends of the winding of the distributing transformers 4b.

With this distributing equipment, the signal applied to the input terminal 1 is delivered to the center tap 5b of the distributing transformer 4b through the matching transformer 4a and the signal is then divided from the distributing transformer 4b to the output terminals for delivery. In this case, the winding portions on the sides of the center tap 5b of the distributing transformer 4b has a turn ratio of 1:1 and consequently the signals appearing at the output terminals 2 and 3 have the same current level. If the turn is changed, the signal of a higher current level will be produced in the winding portion having a smaller number of turns and the signal of a lower current level will be produced in the other winding portion having a greater number of turns. As a result, by suitably selecting the turn ratio, the signals having the desired level ratio can be taken out from the output terminals and thus the equipment can be used as so-called branching equipment.

The purpose of the resistor 7 is to prevent the occurrence of mutual interference by preventing the interaction of undesired signals such as noise between the output terminals 2 and 3, whereby when the noise signal is introduced for example through the output terminal 2, the in-phase component flowing through the resistor 7 and the opposite-phase component tending to flow to the output terminal 3 through the winding of the distributing transformer 4b are caused to cancel each other and thus the noise signal is prevented from appearing at the output terminal 3. However, due to the effect of the floating capacity of the resistor 7 itself, the impedance values for high frequency signals cannot be maintained the same for both the UHF band and the VHF band and consequently the power absorbing resistor 7 cannot fully perform the desired absorbing function throughout the entire receiver frequency band. As a result, the use of the resistor 7 connected in this way cannot completely prevent the interaction of undesired signals between the output terminals and the equipment cannot perform the desired function when it is used as branching equipment for CATV system.

Figure 2:
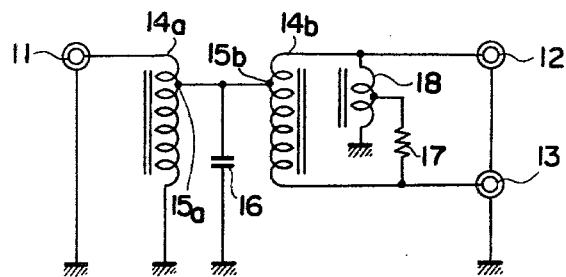
FIG. 2 is a circuit diagram showing other prior art equipment incorporating a balancer transformer for preventing the interaction of signals between the output terminals of the branching equipment.

On the other hand, branching equipment of the type employing a balancer transformer 18 as shown in FIG. 2 has been proposed with a view to preventing the occurrence of mutual interference and ensuring a flat and uniform frequency characteristic throughout a wide range of bands. In the Figure, numeral 11 designates an input terminal, 12 and 13 output terminals, 14a a matching transformer with a tap 15a, 14b a distributing transformer with a tap 15b, 16 a capacitor, and 17 a resistor connected to the tap of the balancer transformer 18. More specifically, in the branching equipment of FIG. 2 the taps 15a and 15b are each so made that the turn ratio of the winding portions on the sides of the tap has a predetermined value and the distributing transformer 14b supplies a signal of a relatively high current level to the main line output terminal 12 and a signal of a relatively low current level to the branch line output terminal 13; the tapped balancer transformer 18 is connected between the ground and the winding end of the distributing transformer 14b connected to the main line output terminal 12, and the resistor 17 is connected between the tap of the balancer transformer 18 and the winding end of the distributing transformer 14b connected to the branch line output terminal 13. However, the branching equipment of FIG. 2 is disadvantageous from both the construction and adjustment points of view in that since the tapped balancer transformer 18 is required in addition to the matching transformer 14a and the distributing transformer 14b, if these transformers are provided by winding their windings on the common core, the arrangement of the transformers, particularly the way of winding their windings will become complicated and moreover positive prevention of mutual interference cannot be ensured unless the balancer transformer 18 is tapped and the resistance value of the resistor 17 is selected in accordance with the turn ratio of the winding portions on the sides of the tap of the distributing transformer 14b in such a manner that the potential at the tap of the balancer transformer 18 and the potential at the winding end of the distributing transformer 14b connected to the branch line output terminal 13, that is, the potentials at the ends of the resistor 17 are held at the same potential.

With the branching equipment for CATV systems provided in accordance with the invention, the foregoing deficiencies of prior art equipment shown in FIGS. 1 and 2 are overcome altogether and moreover the equipment is simplified in construction in that it is only necessary to connect a resistor without the need to connect any coil component.

Figure 3:
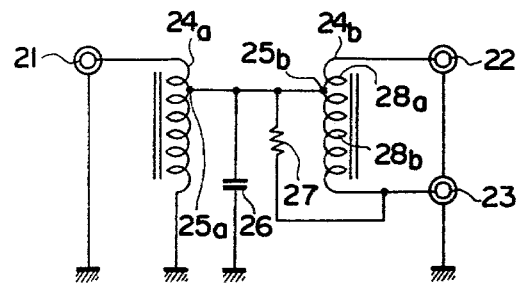
FIG. 3 is a circuit diagram of branching equipment according to the invention.

More specifically, in FIG. 3 showing an embodiment of the invention, numeral 21 designates an input terminal, and 22 and 23 output terminals with the output terminal 22 serving as a main line output terminal and the other output terminal 23 serving as a branch line output terminal. Numeral 24a designates a matching transformer with a tap 25a and its winding has one end connected to the input terminal 21 and the other end grounded. Numeral 24b designates a distributing transformer similarly having a tap 25b and its winding has one end connected to the mainline output terminal 22 and the other end connected to the branch line output terminal 23. The tap 25b is made in such a manner that the ratio of the number of turns in a winding portion 28a on the output terminal 22 side to that in a winding portion 28b on the output terminal 23 side assumes a predetermined value. The taps 25a and 25b of the transformers 24a and 24b are interconnected. A capacitor 26 is connected between the junction of the taps and the ground, and a power absorbing resistor 27 is connected between the tap 25b and the end of the winding portion 28b connected to the branch line output terminal 23.

With the thus constructed branching equipment of this invention, the input signal applied to the input terminal 21 is supplied to the tap 25b of the distributing transformer 24b through the matching transformer 24a. Assuming now that the ratio between the number of turns Na in the winding portion 28a and the number of turns Nb in the winding portion 28b is given by Nb/Na=N, then the ratio of the impedance Za of the winding portion 28a to the impedance Zb of the winding portion 28b is given by Zb/Za=$\sqrt{N}$ as in the case of the ordinary transformer. Thus, assuming that $\sqrt{N}$=n, n/(1+n) and 1/(1+n) of the input signal will be respectively distributed to the main line output terminal 22 and the branch line output terminal 23 and in this way, the input signal will be distributed to the output terminals 22 and 23 with a current level ratio determined by the turn ratio of the winding portions 28a and 28b on the sides of the tap 25b of the distributing transformer 24b.

Usually, TV receivers are connected to the branch line output terminal 23 and consequently there is a risk of a situation arising in which the leakage component of the local oscillation signal is introduced to the branch line output terminal 23 from the tuner of the receiver. If no means is incorporated in the branching equipment to cope with such leakage signal, an interaction will occur between the output terminals 22 and 23 and consequently an interferring noise signal will be caused in the transmission line. In accordance with the invention, the occurrence of interaction due to such undesired signals is prevented in the manner that will be described hereunder.

In other words, in FIG. 3 any undesired signal, such as the leakage component of a local oscillation signal applied to the branch line output terminal 23 flows through a path extending to the input terminal 21 through the winding portion 28b of the distributing transformer 24b and the tap 25b. When this occurs, the undesired signal current flowing in the winding portion 28b induces a corresponding voltage in the winding portion 28a and the polarity of the induced voltage is opposite to the voltage drop caused in the winding portion 28b by the undesired signal current. If the resistance value of the resistor 27 connected in parallel with the winding portion 28b is selected in such a manner that the induced voltage and the voltage drop of the opposite polarity assume the same voltage value, they will cancel each other so that the voltage induced in the winding portion 28a by the undesired signal is absorbed by the resistor 27 and the undesired signal is prevented from causing an interaction between the main line output terminal 22 and the branch line output terminal 23.

On the other hand, when another undesired signal from the main line output terminal 22 tends to cause an interaction between the main line output terminal 22 and the branch line output terminal 23, the mutual inductive action of the undesired signal current flowing in the winding portion 28a induces in the winding portion 28b a voltage which is opposite in polarity to the voltage drop caused in the winding portion 28a by the undesired signal current and the induced voltage is absorbed by the resistor 27, thus similarly preventing any interaction due to the undesired signal. In this way, any interaction of signals between the main line output terminal 22 and the branch line output terminal 23 can be prevented and the provision of the resistor 27 alone has the effect of allowing the distributing transformer 24b to additionally perform the function of the balancer transformer used in the prior art branching equipment.

Figure 4:
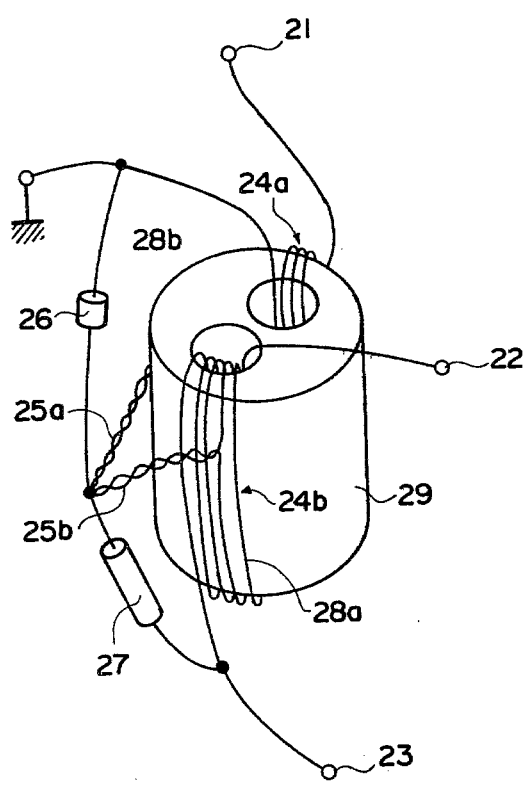
FIG. 4 is a perspective view of branching equipment according to the embodiment of FIG. 3.

Thus, to provide the transformers 24a and 24b, it is only necessary to use a simple construction as shown in FIG. 4 in which the windings of the tapped matching transformer 24a and the tapped distributing transformer 24b are wound on a common core 29 as in the case of prior art equipment of this type and the resistor 27 is simply connected between the tap 25b of the distributing transformer 24b and the winding end of the transformer 24b connected to the branch line output terminal 23.

It will thus be seen from the foregoing that branching equipment for CATV systems according to the invention is simplified in construction in that it is only necessary to connect a resistor between the tap of a distributing transformer and its winding end connected to a branch line output terminal, and the connection of the resistor alone is effective in that any interaction caused between the output terminals by a undesired signal can be cancelled and eliminated in the distributing transformer and moreover only the addition of the resistor is required, thus ensuring a reduced cost and improved transmission quality in that a flat frequency characteristic is ensured throughout a wide range of bands and so on.

We claim:

1. In branching equipment for CATV systems including an input terminal, a pair of output terminals, a matching transformer consisting of a tapped winding having one end thereof connected to said input terminal and other end thereof grounded, and a distributing transformer consisting of a tapped winding having ends thereof respectively connected to said output terminals, the tap of said matching transformer being connected to the tap of said distributing transformer, the number of turns in a portion between one end of the winding and the tap of said distributing transformer being different from that in another portion between the other end of the winding and the tap of said distributing transformer to provide a predetermined ratio, the improvement consisting of a power absorbing resistor connected across one of said winding portions on the sides of the tap of said distributing transformer having a greater number of turns than the other.

* * * * *